(12) United States Patent
Kajita et al.

(10) Patent No.: US 8,766,837 B2
(45) Date of Patent: Jul. 1, 2014

(54) MODULATOR AND ΔΣ-TYPE D/A CONVERTER

(75) Inventors: Tetsuya Kajita, Tokyo (JP); Seita Nashimoto, Tokyo (JP); Naoki Nagashima, Tokyo (JP); Kouji Okuda, Tokyo (JP)

(73) Assignee: Azbil Corporation, Tokyo (JP)

( * ) Notice: Subject to any disclaimer, the term of this patent is extended or adjusted under 35 U.S.C. 154(b) by 0 days.

(21) Appl. No.: 13/522,836

(22) PCT Filed: Sep. 30, 2010

(86) PCT No.: PCT/JP2010/067150
§ 371 (c)(1),
(2), (4) Date: Jul. 18, 2012

(87) PCT Pub. No.: WO2011/089759
PCT Pub. Date: Jul. 28, 2011

(65) Prior Publication Data
US 2012/0286982 A1    Nov. 15, 2012

(30) Foreign Application Priority Data
Jan. 21, 2010    (JP) ................................ 2010-010833

(51) Int. Cl.
*H03M 1/66* (2006.01)
(52) U.S. Cl.
USPC ........... 341/144; 341/110; 341/118; 341/120; 341/143
(58) Field of Classification Search
USPC ......................................... 341/143, 144–154
See application file for complete search history.

(56) References Cited

U.S. PATENT DOCUMENTS

| 5,790,062 | A  | * | 8/1998  | Darnell et al. | 341/143 |
| 5,815,530 | A  | * | 9/1998  | Hirai | 375/247 |
| 5,920,273 | A  | * | 7/1999  | Hirano | 341/144 |
| 6,727,833 | B2 | * | 4/2004  | Zierhofer | 341/143 |
| 6,873,280 | B2 | * | 3/2005  | Robinson et al. | 341/159 |
| 7,146,144 | B2 | * | 12/2006 | Robinson et al. | 455/260 |
| 2005/0129140 | A1 | * | 6/2005  | Robinson | 375/297 |
| 2006/0066464 | A1 | * | 3/2006  | San et al. | 341/155 |
| 2008/0238543 | A1 | * | 10/2008 | Koch | 330/136 |
| 2010/0026541 | A1 | * | 2/2010  | Yamamoto et al. | 341/152 |
| 2011/0133751 | A1 | * | 6/2011  | Kuramochi | 324/555 |
| 2011/0309959 | A1 | * | 12/2011 | Hode et al. | 341/110 |
| 2012/0139766 | A1 | * | 6/2012  | Cyrusian | 341/120 |

FOREIGN PATENT DOCUMENTS

| JP | 2005-012750 A | 1/2005 |
| JP | 2008-035038 A | 2/2008 |

* cited by examiner

*Primary Examiner* — Linh Nguyen
(74) *Attorney, Agent, or Firm* — Troutman Sanders LLP

(57) ABSTRACT

The disclosed device easily and precisely satisfies a requested output range, and is provided with: a ΔΣ-modulator (12) which converts a digital input signal to a pulse signal; an input comparison device (11) which compares an input value that corresponds to the digital input signal, and a pre-set threshold value; and a thinned output control unit (14) which, when the result of the comparison by the input comparison device (11) shows that the input value is less than the threshold value, reduces the output value corresponding to the input value in accordance with the size of the difference between the input value and the threshold value, and sets the output value to 0 when the input value is 0.

11 Claims, 6 Drawing Sheets

MODULATOR AND ΔΣ-TYPE D/A CONVERTER

CROSS REFERENCE TO PRIOR APPLICATIONS

This application is a U.S. National Phase application under 35 U.S.C. §371 of International Application No. PCT/JP2010/067150, filed on Sep. 30, 2010 and claims benefit of priority to Japanese Patent Application No. 2010-010833, filed on Jan. 21, 2010. The International Application was published in Japanese on Jul. 28, 2011 as WO 2011/089759 A1 under PCT Article 21(2). All of these applications are herein incorporated by reference.

FIELD OF TECHNOLOGY

The present disclosure relates to a modulator and a ΔΣ-type D/A converter.

BACKGROUND

Pulse Width Modulation (PWM)-type D/A converters that have PWM modulators, and ΔΣ-type D/A converters that have ΔΣ modulators, for example, are used as D/A converters. PWM converters have a problem in that the amount of power consumed increases as the accuracy is improved, and the accuracy suffers as power consumption is reduced. In contrast, ΔΣ modulators are able to achieve better linearity at low clock frequencies than PWM modulators through oversampling and noise shaping. That is, when compared to PWM-type D/A converters, ΔΣ-type D/A converters have the benefit of making it possible to reduce power consumption and to increase accuracy. A ΔΣ-type D/A converter that converts multi-bit input signals into pulse-stream output signals is disclosed in Japanese Unexamined Patent Application Publication 2008-35038, below.

Typically, the outputs of ΔΣ modulators are density signals that are pulses that represent low and high levels. Unlike a PWM waveform, the density pulse determines the low/high level through a feedback circuit within the ΔΣ modulator, so has no periodicity. In a state wherein the ΔΣ modulator output is constant at either the low level or the high level, the internal feedback circuit is in a saturated state. That is, this state is an aberrant state wherein proper, stable operations cannot be insured. In contrast, in a normal ΔΣ modulator, the output cannot be constant at either the low level or the high level. For example, even if the input signal is at 0, still, if the internal workings of the ΔΣ modulator are operating properly, a high-level pulse is output in a given proportion, in order to maintain the stability of the system, meaning that the output value of the ΔΣ modulator does not go completely to 0. Similarly, even if the value of the input signal is at a maximum, the low level pulse can be output with a given proportion, so that the output value of the ΔΣ modulator is not at the maximum value. The result is that a ΔΣ-type D/A converter wherein the output of a ΔΣ modulator is averaged by a filter circuit to output an analog signal is not able to output, for example, as illustrated in FIG. 6, a voltage between 0 V and 0.1 V, which is in the neighborhood of the lower limit of the output voltage (a lower limit-side non-output range) or output a voltage between 2.4 V and 2.5 V, which is in the neighborhood of the upper limit for the output voltage (an upper limit-side non-output range) when the range of the output voltage is between 0 V and 2.5 V.

Some industrial measurement instruments require outputs beginning at 0 V, such as in, for example, 0 V through 1 V or 0 V through 5 V. When using a ΔΣ-type D/A converter, as described above, in such measurement instruments, it is necessary to provide a separate compensating circuit that includes, for example, a gain adjusting circuit, a voltage source, and the like, in order to achieve an output that starts at 0 V. If the accuracy of the compensating circuit is low, then the accuracy of the ΔΣ-type D/A converter will suffer. On the other hand, raising the accuracy of the compensating circuit to match that of the ΔΣ modulator requires a complex structure, increasing costs.

Given this, the present disclosure is to solve the problems such as set forth above in the conventional technology, and the object thereof is to provide a modulator and a ΔΣ-type D/A converter that is able to satisfy easily the required output range without a loss in accuracy.

SUMMARY

The modulator according to the examples of the present disclosure includes a ΔΣ modulator for converting a digital input signal into a pulse signal; a comparator for comparing an input value that corresponds to the digital input signal to a threshold value that is set in advance; and an output controller for more greatly reducing the output value in relation to the input value, the greater the difference between the input value and the threshold value, when the results of the comparison by the comparator is that the input value is less than the threshold value.

When the input value is smaller than the threshold value, the use of this structure may make it possible to make a ΔΣ-type D/A converter's output value smaller than a conventional ΔΣ modulator's output value. In this case, the smaller the input value becomes, the smaller the ΔΣ-type D/A converter's output value may become.

The output controller described above make it possible to reduce the modulator's output value relative to the input value by forcing low the values of a number of pulses equal to the difference between the input value and the threshold value, of those pulses that are included in the respective pulse trains, by segmenting, into pulse trains comprising a number of pulses equal to the difference between the threshold value and a specific minimum value, pulse signals that are output from a ΔΣ modulator.

When the input value is at the minimum value that can be input as an input signal, then the output controller can set the output value relative to that input value to a value corresponding to that minimum value. Doing so makes it possible to output, as the output value, a value that corresponds to the minimum value, when the input value is at a minimum value.

The modulator according to the examples of the present disclosure includes a ΔΣ modulator for a converting a digital input signal into a pulse signal; a comparator for comparing an input value that corresponds to the digital input signal to a threshold value that is set in advance; and an output controller for more greatly increasing the output value in relation to the input value, the greater the difference between the input value and the threshold value, when the results of the comparison by the comparator is that the input value is greater than the threshold value.

The use of this structure makes it possible to make a ΔΣ-type D/A converter's output value larger than the conventional ΔΣ modulator's output value, the larger the input value when the input value is larger than the threshold value.

The output controller described above make it possible to increase the output value relative to the input value by forcing high the values of a number of pulses equal to the difference between the input value and the threshold value, of those pulses that are included in the respective pulse trains, by segmenting, into pulse trains comprising a number of pulses equal to the difference between a specific maximum value and the threshold value, pulse signals that are output from a ΔΣ modulator.

When the input value is at the maximum value that can be input as an input signal, then the output controller can set the output value relative to that input value to a value corresponding to that maximum value. Doing so makes it possible to output, as the output value, a value that corresponds to the maximum value, when the input value is at a maximum value.

The modulator according to the present disclosure includes: a ΔΣ modulator for converting a digital input signal into a pulse signal; a first comparator for comparing an input signal, corresponding to the digital input signal, to a first threshold value that is set in advance; a second comparator for comparing an input signal, corresponding to the digital input signal, to a second threshold value that is set in advance; first output controller for more greatly reducing the output value relative to the input value the greater the difference between the input value and the first threshold value when the comparison result by the first comparator indicates that the input value is smaller than the first threshold value; and second output controller for more greatly increasing the output value relative to the input value the greater the difference between the input value and the second threshold value when the comparison result by the second comparator indicates that the input value is greater than the second threshold value.

When the input value is smaller than the threshold value, the use of this structure may make it possible to make a ΔΣ-type D/A converter's output value smaller than a conventional ΔΣ modulator's output value. In this case, the smaller the input value becomes, the smaller the ΔΣ-type D/A converter's output value may become. Moreover, it makes it possible to make the output value larger than the actual output value, the larger the input value when the input value is larger than the second threshold value.

The ΔΣ-type D/A converter according to the examples of the present disclosure is provided with a modulator, as set forth above, and an analog filter for smoothing the output signal of the modulator.

The examples of the present disclosure enable the provision of a modulator, and a ΔΣ-type D/A converter, that can satisfy the required output range, easily and with high accuracy.

DETAILED DESCRIPTION

Examples according to the present disclosure are explained below in reference to the drawings. Note that the examples explained below are no more than illustrative, and do not exclude the application of a variety of modifications and technologies not disclosed below. That is, the present disclosure may be embodied in a variety of modifications within a scope that does not deviate from the spirit or intent thereof.

Figure 1:
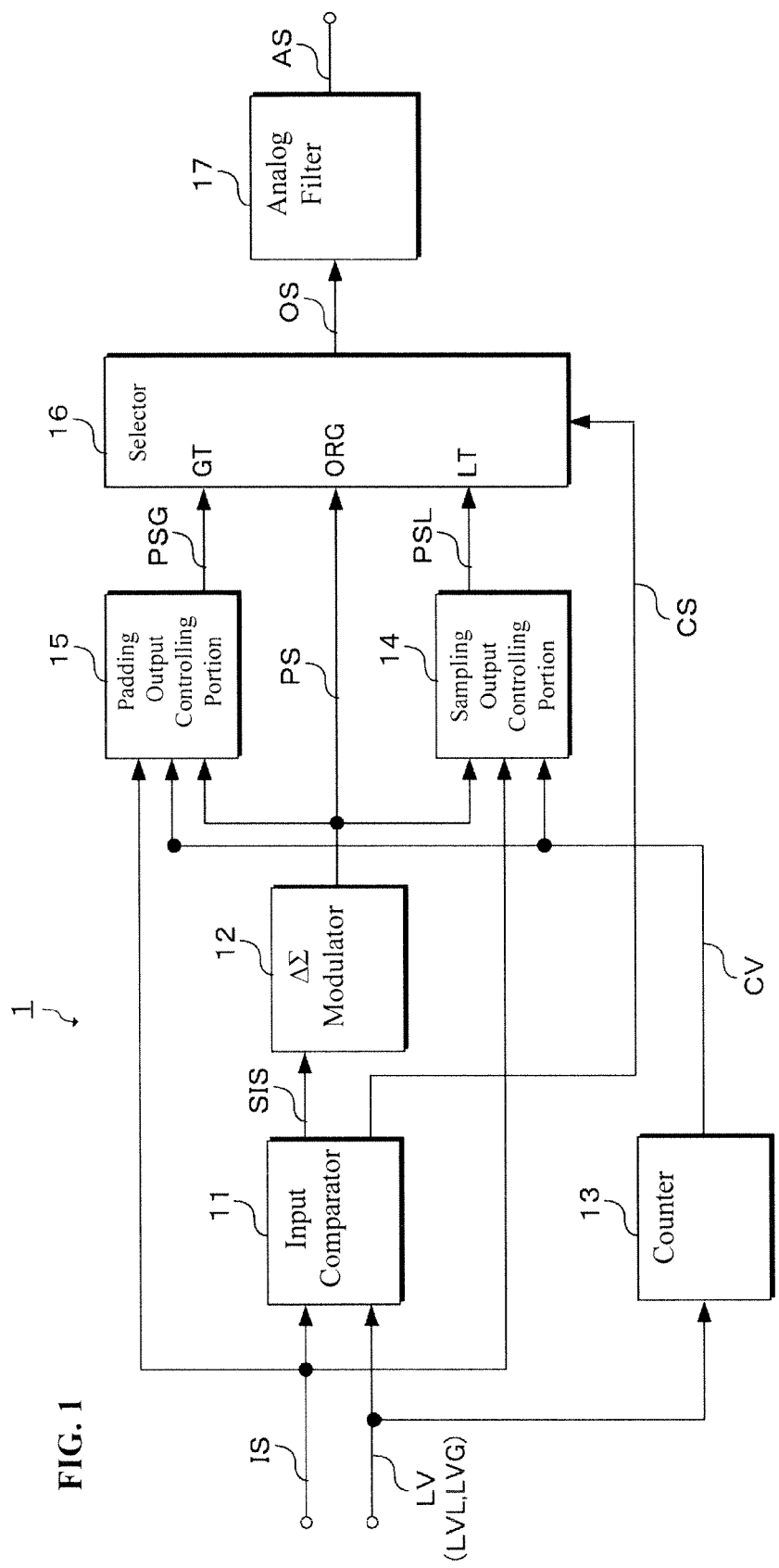
FIG. 1 is a diagram illustrating schematically an example of a structure of a ΔΣ-type D/A converter in an example.

The structure of a ΔΣ-type D/A converter that includes a modulator according to the present example is explained in reference to FIG. 1. FIG. 1 is a diagram illustrating schematically an example of a structure of a ΔΣ-type D/A converter.

As illustrated in this drawing, the ΔΣ-type D/A converter 1 includes an input comparator 11, a ΔΣ modulator 12, a counter 13, a sampling output controlling portion 14, a padding output controlling portion 15, a selector 16, and an analog filter 17. The counter 13, the sampling output controlling portion 14, the padding output controlling portion 15, and the selector 16 constitute an output controller. The input comparator 11, the ΔΣ modulator 12, the counter 13, the sampling output controlling portion 14, the padding output controlling portion 15, and the selector 16 constitute the modulator.

The input comparator compares an input signal, corresponding to a multi-bit digital input signal IS, to threshold values LV that are set in advance. In this example, the explanation will use 16 bits for the example of "multi-bit." The threshold values LV include an upper limit-side threshold value LVG and a lower limit-side threshold value LVL.

The input comparator 11 outputs LT as the comparison result signal CS when the input value is smaller than the lower limit-side threshold value LVL. The input comparator 11 outputs GT as the comparison result signal CS when the input value is larger than the threshold value LVG on the upper limit side. The input comparator 11 outputs ORG as the comparison result signal CS if the input signal is equal to or greater than the threshold value LVL on the lower limit side and equal to or less than the threshold value LVG on the upper limit side.

When ORG is output as the comparison result signal CS, the input comparator 11 outputs the digital input signal IS without modification, as the SIS signal, to the ΔΣ modulator 12. When the input comparator 11 outputs LT as the comparison result signal CS, then the input comparator 11 ties the input value of the digital input signal IS to the lower limit side threshold value LVL, and outputs it as the SIS signal to the ΔΣ modulator 12. When the comparison result signal CS outputs GT, the input comparator 11 ties the input value of the digital input signal IS to the threshold value LVG on the upper limit side, and outputs it as the SIS signal to the ΔΣ modulator 12.

The ΔΣ modulator 12 converts the digital input signal SIS, which is determined by the magnitude of the digital input signal IS, into a pulse signal PS. The pulse signal PS is a density signal of a pulse that is in accordance with the digital input signal IS. In the present example, the explanation uses a signal that is expressed by a binary (low/high) pulse as an example of a pulse signal PS.

The counter 13 counts from zero up to the difference between the threshold value LVL on the lower limit side or the threshold value LVG on the upper limit side, as the maximum value they can be input as the input value. When the count value CV reaches the threshold value LVL on the lower limit side or the aforementioned difference, the counter 13 returns to zero, and counting up to the threshold value LVL on the lower limit side, or to the aforementioned difference, is repeated. Note that the count value CV need not necessarily start counting from 0. For example, if the minimum value that can be input as an input value is other than zero, then the counting may start from that minimum value.

The sampling output controlling portion 14 more greatly reduces the output value from the sampling output controlling portion 14 relative to the input value, the greater the difference between the input value and the threshold value LVL on the lower limit side when the comparison result signal CS indicates LT. In this case, the sampling output controlling portion 14 more greatly reduces the output value depending on the difference between the input value and the threshold value LVL on the lower limit side so that when the input value is the minimum value that can be input as the input value (where the explanation below is for the case wherein the minimum value is 0), the output value can be the value that corresponds to this minimum value (where the explanation below is for the case wherein this value is 0).

Specifically, when the comparison result signal CS indicates LT, the sampling output controlling portion 14 segments the pulse signal PS that is output from the ΔΣ modulator 12 into pulse trains comprising a number of pulses equal to the threshold value LVL on the lower limit side, and then, of the pulses that are included in each of these pulse trains, steadily reduces the output value by forcibly tying low a number of pulses that is equal to the difference between the input value and the threshold value LVL on the lower limit side.

Figure 2:
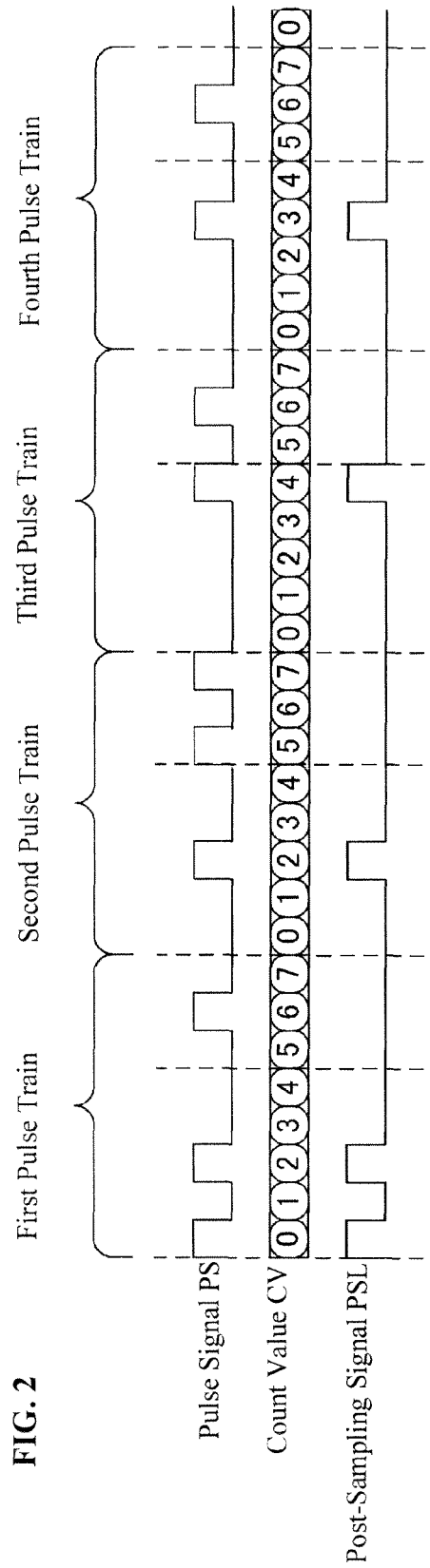
FIG. 2 is a diagram for explaining the detail of the post-sampling signal output from the sampling output controlling portion illustrated in FIG. 1.

This is explained in greater detail in reference to FIG. 2. FIG. 2 is a diagram for explaining the details of the post-sampling signal PSL that is output from the sampling output controlling portion 14 when the threshold value LVL on the lower limit side is 0x0008 and the input value corresponding to the digital input signal IS is 0x0005. The pulse signal PS illustrated in FIG. 2 is the signal that is output from the ΔΣ modulator 12 and input into the sampling output controlling portion 14. The count value CV is a value that is output from the counter 13 and input into the sampling output controlling portion 14. The counter 13 repetitively counts up 8 counts, from 0 through 7, based on the 0x0008 of the threshold value LVL on the lower limit side, which is included in the threshold values LV, to output the count value CV to the sampling output controlling portion 14. The pulse signal PS is segmented into pulse trains consisting of 8 pulses through the count value CV of 0 through 7. For example, the pulse signal PS illustrated in FIG. 2 is segmented into four pulse trains.

The sampling output controlling portion 14 outputs without modification, as the post-sampling signal PSL, the five pulses that are identified as the 0 through 4 count values. The number of pulses that are output without modification is set to be the same number as the input value. Here the input value is 0x0005, and thus the number of pulses that are output without modification is set to 5.

Following this, the sampling output controlling portion 14 forcibly ties low the three pulses identified by the count values 5 through 7, which are the remaining pulses in each of the pulse trains, and outputs the post-sampling signal PSL. The number of pulses that are forcibly tied low is set to the same number as the difference between the threshold value LVL on the lower limit side and the input value. Here the threshold value LVL on the lower limit side is 0x0008, and the input value is 0x0005, and thus the number of pulses that are forcibly tied low is set to 3.

The pulse train from the ΔΣ modulator may be averaged over a long period in accordance with an oversampling ratio which is the ratio of an oversampling rate over an output data rate. In this example, the averaged value of the pulse signals PS over pulse trains is anticipated to become "1/4." On that basis, the output result by the sampling output controlling portion 14 is explained in detail using only four pulse trains of the whole pulse trains, as illustrated in FIG. 2 for simplicity. In FIG. 2, the average values of the only four pulse trains calculated as shown in (1), below, is 5/16 which is approximately equal to 1/4. On the other hand, the value of the post-sampling signal PSL, when the values of the four pulse trains are averaged, will be 5/32 as shown in (2), below. The 5/32 corresponds to a value that is 5/8 times the 1/4 that is the value for the pulse signals PS. That is, the post-sampling signal PSL in this case is reduced to 5/8 of the value of the output pulse signal PS wherein the pulse is output without modification.

$$\{(3/8)+(3/8)+(2/8)+(2/8)\}/4=5/16\approx1/4 \quad (1)$$

$$\{(2/8)+(1/8)+(1/8)+(1/8)\}/4=5/32 \quad (2)$$

If the input value is lower than the threshold value LVL on the lower limit side, as it is here, then forcibly tying low a number of pulses that is equal to the difference between the threshold value LVL on the lower limit side and the input value, of the pulses included in the pulse trains, makes it possible to reduce the value of the post-sampling signal PSL commensurate with the magnitude of the difference between the threshold value LVL on the lower limit side and the input value. Moreover, if the input signal is 0, then all of the pulses will be forcibly tied low and then output, making it possible to cause the value of the post-sampling signal PSL to go to 0.

Note that for convenience in the explanation, the explanation is for a case wherein the average value of the four pulse trains is calculated in the explanation of the output results by the sampling output controlling portion 14, described above; however the number of pulse trains when calculating the average is not limited to 4. The greater the number of pulse trains, the more it is possible to increase the accuracy of the average value that is calculated. The number of pulse trains to be used can be established depending on the output accuracy.

The padding output controlling portion 15 more greatly increases the output value from the padding output controlling portion 15 relative to the input value, the greater the difference between the input value and the threshold value LVG on the upper limit side when the comparison result signal CS indicates GT. In this case, the padding output controlling portion 15 more greatly increases the output value depending on the difference between the input value and the threshold value LVG on the upper limit side so that when the input value is the maximum value that can be input as the input value, the output value will be the value that corresponds to this maximum value.

Specifically, when the comparison result signal CS indicates GT, the padding output controlling portion 15 segments the pulse signal PS that is output from the ΔΣ modulator 12 into pulse trains comprising a number of pulses equal to the difference between the maximum value of the input value and the threshold value LVG on the upper limit side, and then, of the pulses that are included in each of these pulse trains, steadily increases the output value by forcibly tying high a number of pulses that is equal to the difference between the input value and the threshold value LVG on the upper limit side.

Figure 3:
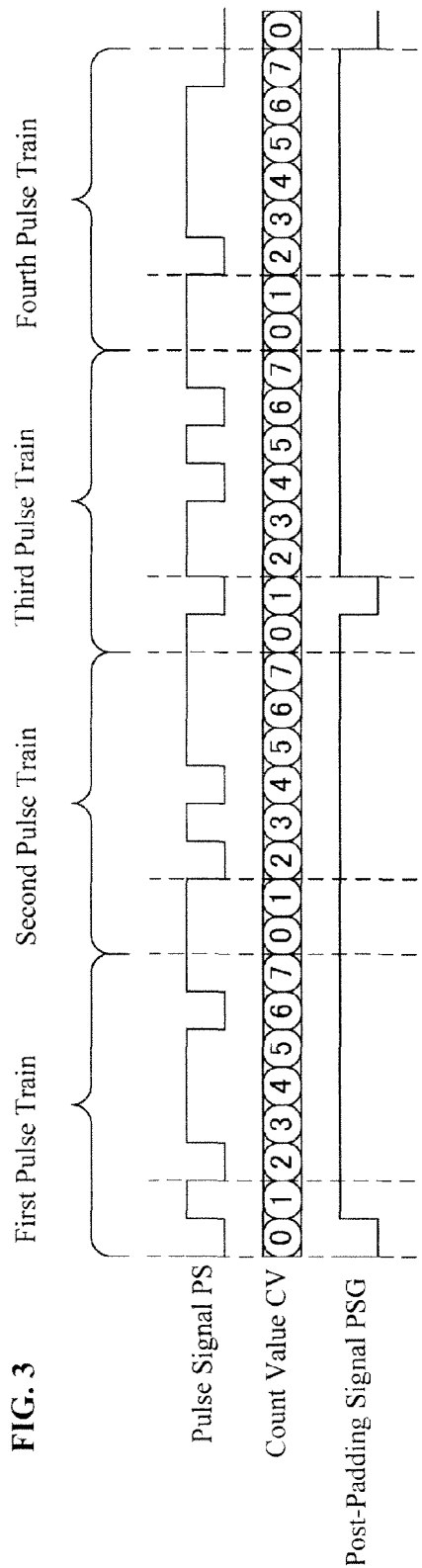
FIG. 3 is a diagram for explaining the detail of the post-padding signal output from the padding output controlling portion illustrated in FIG. 1.

This is explained in greater detail in reference to FIG. 3. FIG. 3 is a diagram for explaining the details of the post-padding signal PSG that is output from the padding output controlling portion 15 when the threshold value LVG on the upper limit side is 0xFFF7 and the input value corresponding to the digital input signal IS is 0xFFFD. The pulse signal PS illustrated in FIG. 3 is the signal that is output from the ΔΣ modulator 12 and input into the padding output controlling portion 15. The count value CV is a value that is output from the counter 13 and input into the padding output controlling portion 15. The counter 13 repetitively counts up 8 counts, from 0 through 7, based on the 0xFFF that is the maximum value for the input value and on the 0xFFF7 of the threshold value LVG on the upper limit side, which is included in the threshold values LV, to output the count value CV to the padding output controlling portion 15. The pulse signal PS is segmented into pulse trains consisting of 8 pulses through the count value CV of 0 through 7. For example, the pulse signal PS illustrated in FIG. 3 is segmented into four pulse trains.

The padding output controlling portion 15 outputs without modification, as the post-padding signal PSG, the 2 pulses that are identified as the 0 and 1 count values. The number of pulses that are output without modification is set to be the same number as the difference between the input value in the maximum value for the input value. Here maximum value for the input value is 0xFFFF and the input value is 0xFFFD, and thus the number of pulses that are output without modification is set to 2.

Following this, the padding output controlling portion 15 forcibly ties high the six pulses identified by the count values 2 through 7, which are the remaining pulses in each of the pulse trains, and outputs the post-padding signal PSG. The number of pulses that are forcibly tied high is set to the same number as the difference between the input value and the threshold value LVG on the upper limit side. Here the input value is 0xFFFD and the threshold value LVG on the upper limit side is 0xFFF7, and thus the number of pulses that are forcibly tied high is set to 6.

The output result by the padding output controlling portion 15 will be explained in detail using the four pulse trains illustrated in FIG. 3. When the values of the pulse signals PS are averaged over the values of the four pulse trains, then, in contrast to being the "11/16" as illustrated in (3), below, the value of the post-padding signal PSG, when the values of the four pulse trains are averaged, will be 15/16 as shown in (4), below. The 15/16 corresponds to a value that is 15/11 times the 11/16 that is the value for the pulse signals PS. That is, the post-padding signal PSG in this case is increased to 15/11 of the value of the output pulse signal PS wherein the pulse is output without modification.

$$\{(5/8)+(6/8)+(5/8)+(6/8)\}/4=11/16 \quad (3)$$

$$\{(7/8)+(8/8)+(7/8)+(8/8)\}/4=15/16 \quad (4)$$

If the input value is higher than the threshold value LVG on the higher limit side, as it is here, then forcibly tying high a number of pulses that is equal to the difference between the threshold value LVG on the higher limit side and the input value, of the pulses included in the pulse trains, makes it possible to increase the value of the post-padding signal PSG commensurate with the magnitude of the difference between the input value and the threshold value LVG on the upper limit side. Moreover, if the input signal is the maximum value, then all of the pulses are forcibly tied high and then output, making it possible to cause the value of the post-padding signal PSG to go to the maximum value.

Based on the comparison result signal CS, the selector 16 selects an output pulse signal OS that is output to the analog filter 17. Specifically, if the comparison result signal CS indicates GT, then the selector 16 outputs, as the output pulse signal OS, the post-padding signal PSG to the analog filter 17. If the comparison result signal CS indicates LT, then the selector 16 outputs, as the output pulse signal OS, the post-sampling signal PSL to the analog filter 17. If the comparison result signal CS indicates ORG, then the selector 16 outputs, without modification, the pulse signal PS that is output from the ΔΣ modulator 12 as the output pulse signal OS to the analog filter 17.

The analog filter 17 removes the high-frequency component from the output pulse signal OS (that is, smoothes it), to output an analog signal AS. A filter circuit that is provided with a buffer amp and a low-pass filter that has a resistance and a capacitor, for example, may be used as the analog filter 17.

Figure 4:
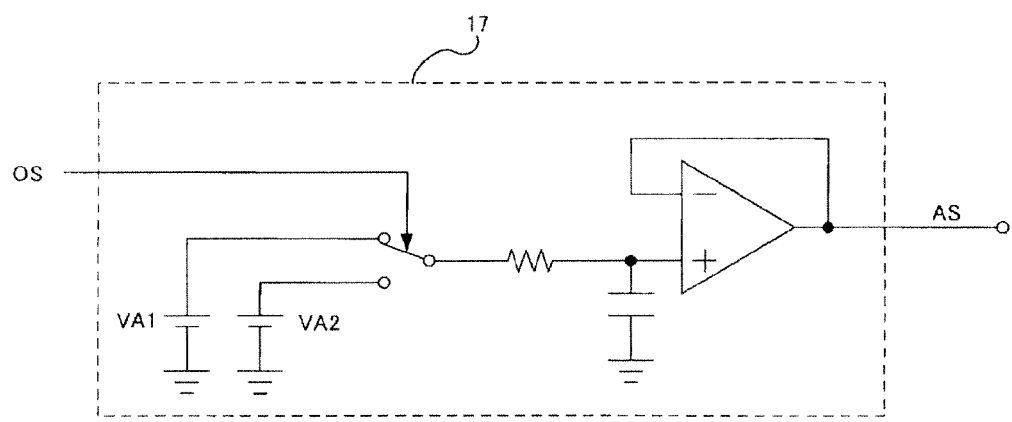
FIG. 4 is a diagram illustrating an example of a circuit structure of the analog filter, illustrated in FIG. 1

Here the analog filter 17 may be structured so as to smooth the output pulse signal OS without modification through a low-pass filter, but, as illustrated in FIG. 4, may also be structured so as to smooth, through a low-pass filter, a power supply voltage that is selected through switching, using the output pulse signal OS, the power supply VA1 and power supply VA2 for outputting different voltages that are set arbitrarily. With such a structure, if, for example, the voltage of the power supply VA1 is 2.5 V and the voltage of the power supply VA2 is 0.0 V, then a voltage in the range of 0 V to 2.5 V will be output as the output range for the analog signal AS that is the result of the D/A conversion.

Figure 5:
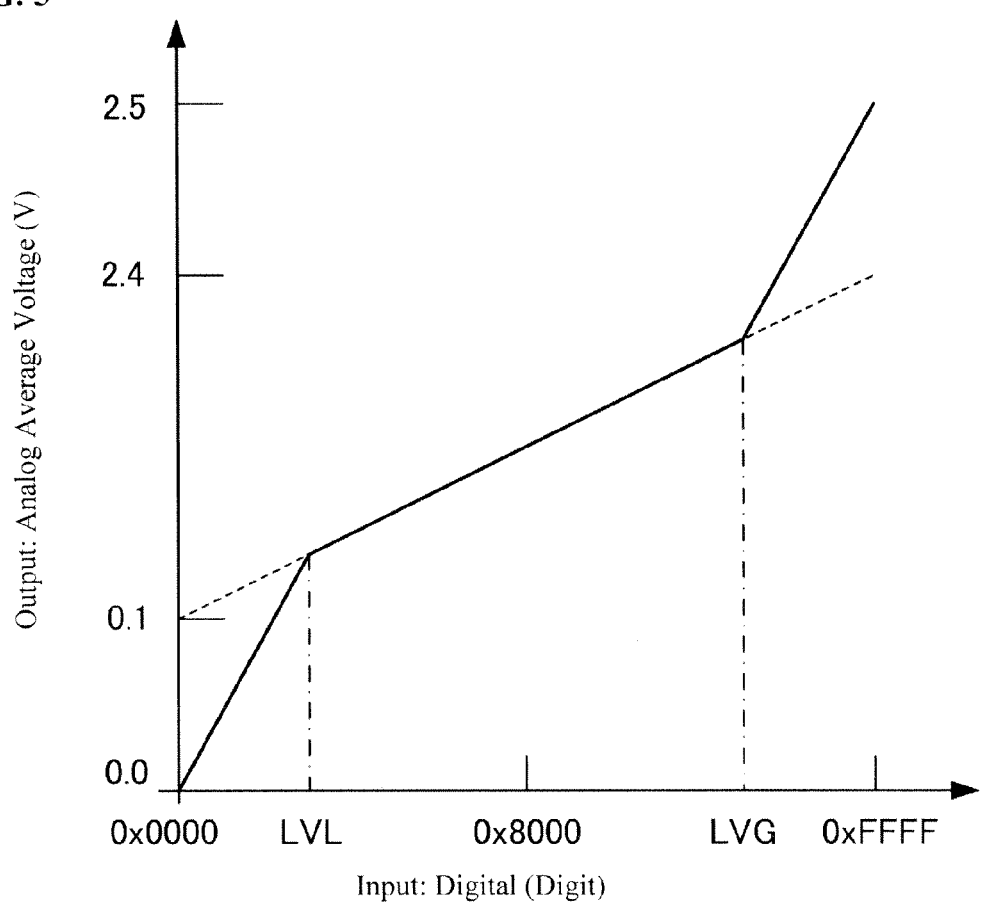
FIG. 5 is a diagram illustrating the relationship between the input values and output values in the ΔΣ-type D/A converter illustrated in FIG. 1.

As illustrated in FIG. 5, the ΔΣ-type D/A converter 1 according to the present example makes it possible to reduce the output value further beyond the conventional output value the smaller the input value when the input value is smaller than the threshold value LVL on the lower limit side, enabling the output of the minimum value of 0 V as the output value when the input value is the minimum value of 0x0000. Moreover, it makes it possible to increase the output value further beyond the conventional output value the larger the input value when the input value is larger than the threshold value LVG on the upper limit side, enabling the output of the maximum value of 2.5 V as the output value when the input value is the maximum value of 0xFFFF.

As a result, it is possible to output voltages from 0 V through 2.5 V, which is the required output range, through passing through the analog filter 17 illustrated in FIG. 4, thus making it possible to satisfy the required output range. Note that the minimum value for the output value need not necessarily be limited to 0 V. For example, if the voltage of the power supply VA1 illustrated in FIG. 4 is 2.5 V and the voltage of the power supply VA2 is 1.0 V, then the output range will be from 1.0 V to 2.5 V, in which case the minimum value for the output value will be 1.0 V.

Figure 6:
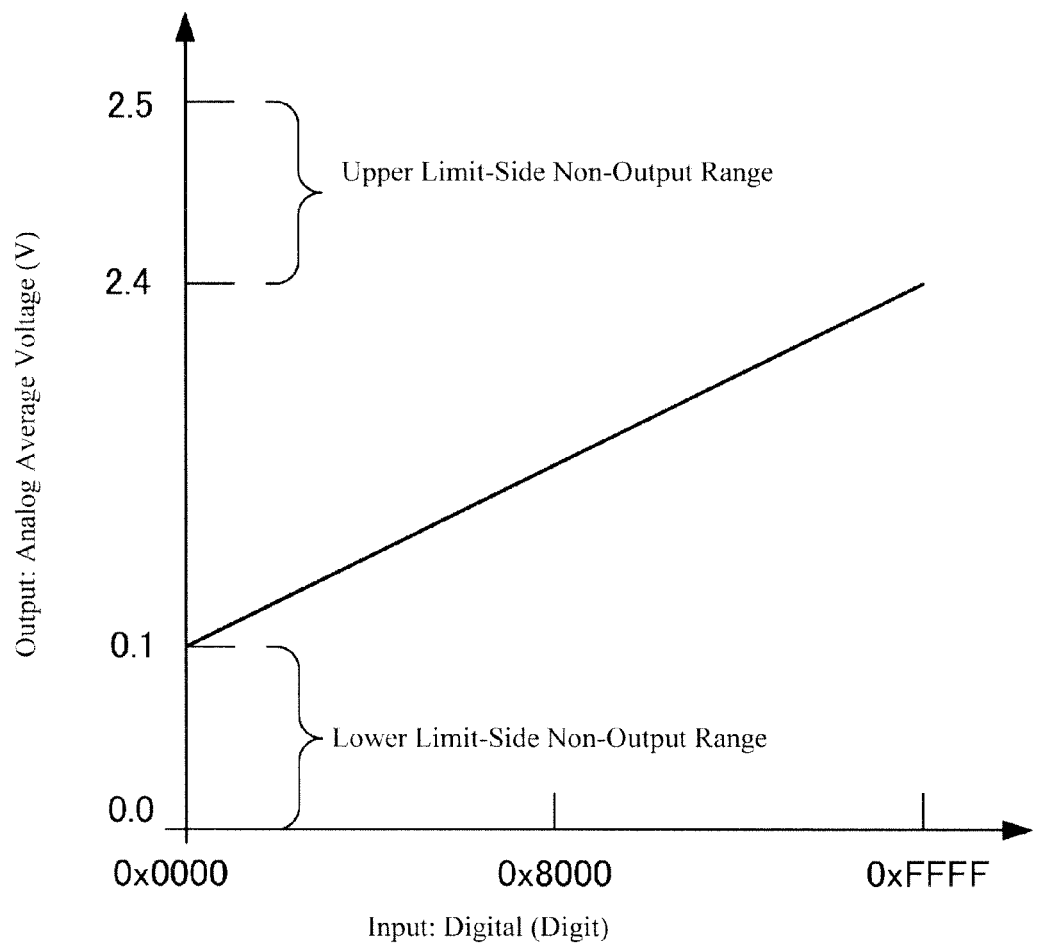
FIG. 6 is a diagram illustrating the relationship between the input values and output values in a conventional ΔΣ-type D/A converter.

Moreover, the output values for which the output is enabled through the sampling output controlling portion 14 and the padding output controlling portion 15 (for example, the lower limit-side non-output range shown in FIG. 6 (0 V through 1 V)) or upper limit-side non-output range (2.4 V through 2.5 V)) can be used in the signal values for providing stepwise notification of error states within the equipment, or in signal values for providing notification of operating errors in various setting parameters, or the like.

Note that while in the example of embodiment set forth above an output controlling portion with both the sampling output controlling portion 14 and the padding output controlling portion 15 is provided, one or the other may be provided alone instead.

Moreover, while in the example set forth above the explanation is for a case wherein the difference between the threshold value LVL on the lower-limit side and the minimum value of 0 is equal to the difference between the maximum value and the threshold value LVG on the upper-limit side, the respective differences need not necessarily be identical. However, because having the difference between the threshold value LVL on the lower-limit side and the minimum value of 0 be equal to the difference between the maximum value and the threshold value LVG on the upper-limit side makes it possible to have the number of pulses in the pulse train in the sampling output controlling portion 14 be equal to the number of pulses in the pulse train in the padding output controlling portion 15, thus making it possible to have common elements included in the output controller.

Moreover, while the sampling output controlling portion 14 and the padding output controlling portion 15 in the example set forth above are processes that perform sequential selections beginning with the first pulses in the pulse train, the selections need not necessarily be sequential from the first pulse in the pulse train. Insofar as it is possible to select, from among the pulses that are included in the pulse train, pulses equal to the number that has been set for the number of pulses that are output without modification, and possible to select the number of pulses that has been set as the number of pulses that are forcibly tied to low or high, the method by which the selections are made does not matter. For example, they may be selected at random from within the pulse train. Conversely, a toggle counter, for example, may be used to select pulses sequentially starting with the pulse corresponding to the count value that follows the count value that corresponds to the pulse that is selected last the previous time. Changing the positions of the selected pulses makes it possible to increase the accuracy further due to the ability to perform shaping of the noise in the average value that would result from the positions of the pulses that are selected.

Moreover, while in the example set forth above the explanation is for a case wherein the value of the digital input signal is expressed as a positive binary number, it may instead be expressed by the binary complement of the value of the digital input signal. The use of the binary complement enables a simplification of the computer calculations. For example, when the digital input signal values of 0X0000 through 0xFFFF, which are expressed as a 16-bit binary numbers, as described above, are expressed as a 16-bit binary complements, then the digital signal values will be from 0x8000 through 0x7FFF. Of these values, 0x8000 through 0xFFFF express negative numbers, where the maximum negative value is 0x8000.

Moreover, because the $\Delta\Sigma$ modulator 12 in the example set forth above outputs a density pulse signal, the pulses are output at random at a constant proportion. However, when the input pulses are constant, there may be periodicity in the proportion of the output. Given this, in order to increase the randomness of the output from the $\Delta\Sigma$ modulator 12, a dithering signal may be added to the signal that is input into the $\Delta\Sigma$ modulator 12. The addition of the dithering signal to the input signal or into an internal feedback circuit loop within the $\Delta\Sigma$ modulator 12 makes it possible to further increase the randomness with which the positions wherein the high pulses appear and in the number of pulses. Doing so makes it possible to eliminate biases in the output values that are produced through periodic noise, making it possible to further increase the output accuracy. Note that means for reducing noise through the addition of a dithering signal are a well-known technology, disclosed in, for example, Japanese Unexamined Patent Application Publication H5-284033.

The modulator and $\Delta\Sigma$-type D/A converter according to the present disclosure can be applied to satisfying a required output range easily, without reducing accuracy.

The invention claimed is:

1. A modulator comprising:
a $\Delta\Sigma$ modulator that converts a digital input signal into a pulse signal;
a comparator that compares a value of the digital input signal to a threshold value that is set in advance; and
an output controller that more greatly reduces an output value relative to the value of the digital input signal as a difference between the value of the digital input signal and the threshold value becomes greater when a comparison result by the comparator indicates that the value of the digital input signal is smaller than the threshold value.

2. The modulator as set forth in claim 1, wherein:
the output controller segments the pulse signal that is output from the $\Delta\Sigma$ modulator into pulse trains comprising a number of pulses equal to a difference between the threshold value and a specific minimum value, and reduces the output value relative to the value of the digital input signal by forcibly tying low to a value for a number of pulses equal to the difference between the input value and the threshold value, of the pulses included in each of the pulse trains.

3. The modulator as set forth in claim 1, wherein:
the output controller sets the output value corresponding to the value of the digital input signal to a value corresponding to a minimum value when the value of the digital input signal is the minimum value that is input as the value of the digital input signal.

4. A $\Delta\Sigma$-type D/A converter comprising:
a modulator as set forth in claim 1; and
an analog filter that smoothes the output signal from the modulator.

5. A modulator comprising:
a $\Delta\Sigma$ modulator that coverts a digital input signal into a pulse signal;
a comparator that compares a value of the digital input signal to a threshold value that is set in advance; and
an output controller that more greatly increases an output value relative to the value of the digital input signal as a difference between the value of the digital input signal and the threshold value becomes greater when a comparison result by the comparator indicates that the value of the digital input signal is greater than the threshold value.

6. A modulator as set forth in claim 5, wherein:
the output controller segments the pulse signal that is output from the $\Delta\Sigma$ modulator into pulse trains comprising a number of pulses equal to a difference between a specific maximum value and the threshold value, and increases the output value relative to the value of the digital input signal by forcibly tying high to a value for a number of pulses equal to the difference between the input value and the threshold value, of the pulses included in each of the pulse trains.

7. The modulator as set forth in claim 5, wherein:
the output controller sets the output value corresponding to the value of the digital input signal to a value corresponding to a maximum value when the value of the digital input signal is the maximum value that is input as the value of the digital input signal.

8. A $\Delta\Sigma$-type D/A converter comprising:
a modulator as set forth in claim 5; and
an analog filter that smoothes the output signal from the modulator.

9. A modulator comprising:
a $\Delta\Sigma$ modulator converting a digital input signal into a pulse signal;
a first comparator comparing an input signal, corresponding to the digital input signal, to a first threshold value that is set in advance;
a second comparator comparing an input signal, corresponding to the digital input signal, to a second threshold value that is set in advance;
a first output controller more greatly reducing the output value relative to the input value the greater the difference between the input value and the first threshold value when the comparison result by the first comparator indicates that the input value is smaller than the first threshold value; and a second output controller more greatly increasing the output value relative to the input value the greater the difference between the input value and the second threshold value when the comparison result by the second comparator indicates that the input value is greater than the second threshold value.

10. The modulator as set forth in claim 9, wherein:

the difference between the first threshold value and the minimum value that is input as the input value is equal to the difference between the second threshold value and the maximum value that is input as the input value.

11. A ΔΣ-type D/A converter comprising:

a modulator as set forth in claim 9; and an analog filter smoothing the output signal from the modulator.

* * * * *